United States Patent
Nanataki et al.

(10) Patent No.: US 7,221,075 B2
(45) Date of Patent: May 22, 2007

(54) PIEZOELECTRIC/ELECTROSTRICTIVE DEVICE

(75) Inventors: Tsutomu Nanataki, Toyoake (JP); Kunihiko Yoshioka, Nagoya (JP); Hirofumi Yamaguchi, Komaki (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 11/281,645

(22) Filed: Nov. 17, 2005

(65) Prior Publication Data

US 2006/0108896 A1    May 25, 2006

(30) Foreign Application Priority Data

Nov. 19, 2004    (JP)    .............. 2004-335751

(51) Int. Cl.
    *B41J 2/45*    (2006.01)
(52) U.S. Cl. .................. 310/324; 347/68; 347/69; 347/70; 347/71
(58) Field of Classification Search ................ 310/324; 367/157, 163; 347/68–72
    See application file for complete search history.

(56) References Cited

U.S. PATENT DOCUMENTS

| | | | |
|---|---|---|---|
| 5,545,461 A | 8/1996 | Takeuchi et al. | 428/138 |
| 5,774,961 A * | 7/1998 | Takeuchi et al. | 29/25.35 |
| 5,852,337 A * | 12/1998 | Takeuchi et al. | 310/324 |
| 5,889,351 A | 3/1999 | Okumura et al. | 310/321 |
| 5,997,671 A * | 12/1999 | Takeuchi et al. | 310/324 |
| 6,108,880 A * | 8/2000 | Takeuchi et al. | 29/25.35 |
| 6,348,115 B1 | 2/2002 | Takeuchi et al. | 156/89.11 |
| 6,407,481 B1 * | 6/2002 | Takeuchi et al. | 310/324 |
| 6,541,895 B2 | 4/2003 | Yamaguchi | 310/324 |

FOREIGN PATENT DOCUMENTS

| | | |
|---|---|---|
| JP | H08-201265 | 8/1996 |
| JP | 2002-261347 | 9/2002 |

OTHER PUBLICATIONS

U.S. Appl. No. 11/089,113, filed Mar. 24, 2005, Yamaguchi et al.
U.S. Appl. No. 11/282,013, filed Nov. 17, 2005, Nanataki et al.

* cited by examiner

*Primary Examiner*—Darren Schuberg
*Assistant Examiner*—J. Aguirrechea
(74) *Attorney, Agent, or Firm*—Burr & Brown

(57) ABSTRACT

A piezoelectric/electrostrictive device includes: a ceramic substrate having a thick portion and a thin diaphragm portion; and a piezoelectric/electrostrictive element having a layered structure including a lower electrode, a piezoelectric/electrostrictive film, and an upper electrode, and the thin diaphragm portion of the ceramic substrate is constituted to vibrate in conjunction with the driving of the piezoelectric/electrostrictive element. Furthermore, shape and dimension relations defined in the following (A) to (C) are satisfied: (A) a shape of the thin diaphragm portion 12 is an outward protruding arch shape, and an outward protrusion height of the arch shape is in a range of 5 to 50 μm; (B) a mounting width of the thin diaphragm portion is in a range of 600 to 2000 μm; and (C) a ratio (height/width) of the height to the width of the thick portion is in a range of 0.25 to 3. According to the piezoelectric/electrostrictive device, vibration of a thin diaphragm portion is effectively prevented from being damped, and the device maintains displacement (amplitude) to be high and is superior in response and highprecision (highresolution, high-sensitivity) detection is possible.

9 Claims, 7 Drawing Sheets

PIEZOELECTRIC/ELECTROSTRICTIVE DEVICE

This application claims the benefit of Japanese Application No. 2004-335751, filed Nov. 19, 2004, the entirety of which is incorporated herein by reference.

BACKGROUND OF THE INVENTION

1. Field of the Invention

The present invention relates to a piezoelectric/electrostrictive device, more particularly to a piezoelectric/electrostrictive device for use as an actuator utilizing a flexural displacement, or various types of sensors (e.g., a sensor for a microphone, a viscosity sensor, etc.) for detecting fluid properties, sound pressure, micro weight, acceleration and the like.

2. Description of the Related Art

A piezoelectric/electrostrictive device is used as an actuator or various types of sensors. As such piezoelectric/electrostrictive device, there is disclosed, for example, a device for use in measuring fluid properties such as density, concentration, and viscosity (see Japanese Patent Application Laid-Open No. 8-201265). Such piezoelectric/electrostrictive device is used as a sensor by utilizing correlation between amplitude of the piezoelectric/electrostrictive device as a vibrator and viscous resistance of the fluid brought into contact with the piezoelectric/electrostrictive device (vibrator).

In general, it is possible to replace a vibration configuration such as the vibration of the vibrator in a mechanical system with an equivalent circuit in an electrical system. When the piezoelectric/electrostrictive device (vibrator) is vibrated in a fluid, this vibrator receives a mechanical resistance based on the viscous resistance of the fluid, and accordingly an electric constant of the equivalent circuit of a piezoelectric/electrostrictive element constituting the vibrator changes. By utilizing this, fluid properties such as the viscosity, the density, and the concentration are measured. Here, examples of a measurable fluid include a liquid and a gas. Such liquid may comprise a single component such as water, alcohol, or oil. Examples of the liquid include a liquid obtained by dissolving, mixing, or suspending a soluble or insoluble medium in the component, a slurry, and a paste.

Moreover, examples of the electric constant to be detected include loss coefficient, phase, resistance, reactance, conductance, susceptance, inductance, and capacitance. The loss coefficient or the phase is especially preferably used which has one maximum or minimum change point in the vicinity of a resonance frequency of the equivalent circuit. Accordingly, it is possible to measure not only the viscosity of the fluid but also the density or the concentration thereof (e.g., sulfuric acid concentration in an aqueous sulfuric acid solution). It is to be noted that in addition to the electric constant, a change of the resonance frequency may be utilized as an index for detecting the change of the vibration configuration as long as there is not any special problem from viewpoints of measurement precision and durability. In a case where a ferroelectric is used as the piezoelectric/electrostrictive element, there is detected as a voltage an electric charge generated from a delay of a dipole moment of the ferroelectric after a pulsed electric field is given. A change of the electric charge may be utilized.

As such piezoelectric/electrostrictive device, there is disclosed a device comprising: a ceramic substrate having a thick portion, and a thin diaphragm portion which is formed integrally with the thick portion to form a cavity; and a piezoelectric/electrostrictive element fixed to an outer surface of the substrate. An auxiliary electrode is formed in a position independent of a lower electrode constituting the piezoelectric/electrostrictive element in such a manner that a part of the auxiliary electrode is disposed under a part of the piezoelectric/electrostrictive film (see Japanese Patent Application Laid-Open No. 2002-261347). According to such constitution, an upper electrode can be formed on the surfaces of the auxiliary electrode and the piezoelectric/electrostrictive element continuously without breaking of wire, and reliability of connection of the upper electrode can be enhanced. It is to be noted that a fluid to be measured is introduced into the cavity via a through hole to fill in the cavity. Furthermore, when the auxiliary electrode is continuously formed on not only the outer surface of the thin diaphragm portion but also the thick portion, it is possible to obtain the piezoelectric/electrostrictive device which has stabilized device properties and which is not easily limited by use conditions.

In the piezoelectric/electrostrictive devices disclosed in the above-described patent documents and the like, although the thin diaphragm portion only is to be vibrated in conjunction with driving of the piezoelectric/electrostrictive element, in actual, not only the thin diaphragm portion but also the thick portion are vibrated, vibration energy of the thin diaphragm portion damps, and displacement (amplitude) is decreased. Moreover, since response is lowered, there is a problem that it is difficult to perform high-precision (high-resolution, high-sensitivity) detection.

SUMMARY OF THE INVENTION

The present invention has been developed in view of the above-described problems, and an object is to provide a piezoelectric/electrostrictive device which is superior in response and in which high-precision (high-resolution, high-sensitivity) detection is possible, while effectively preventing damp of vibration of a thin diaphragm portion and maintaining displacement (amplitude) to be high.

To achieve the object, according to the present invention, there is provided the following piezoelectric/electrostrictive device.

[1] A piezoelectric/electrostrictive device comprising a ceramic substrate having a thick portion, a thin diaphragm portion mounted integrally on an end surface of the thick portion, and a cavity formed by the thick portion and the thin diaphragm portion to communicate with the outside; and a piezoelectric/electrostrictive element having a layered structure fixed to an outer surface of the thin diaphragm portion of the ceramic substrate and including a lower electrode, a piezoelectric/electrostrictive film, and an upper electrode, the thin diaphragm portion of the ceramic substrate being vibrated in conjunction with driving of the piezoelectric/electrostrictive element, wherein shape and dimension relations defined in the following (A) to (C) are satisfied:

(A) a shape of the thin diaphragm portion is an outward protruding arch shape, and an outward protrusion height of the arch shape is in a range of 5 to 50 µm;

(B) a mounting width of the thin diaphragm portion is in a range of 600 to 2000 µm; and (C) a ratio (height/width) of the height to the width of the thick portion is in a range of 0.25 to 3.

[2] The piezoelectric/electrostrictive device according to the above paragraph [1], comprising: a plurality of thin diaphragm portions; and a plurality of piezoelectric/electrostrictive elements fixed onto the outer surfaces of the thin diaphragm portions, the thin diaphragm portions and the piezoelectric/electrostrictive elements being disposed on a first plane and/or a second plane parallel to the first plane, respectively.

[3] The piezoelectric/electrostrictive device according to the above paragraph [1], comprising: a plurality of thin diaphragm portions; and a plurality of piezoelectric/electrostrictive elements fixed onto the outer surfaces of the thin diaphragm portions, the thin diaphragm portions and the piezoelectric/electrostrictive elements being disposed on a first plane, a second plane parallel to the first plane, and/or a third plane vertical to the first plane, respectively.

[4] The piezoelectric/electrostrictive device according to any one of the above paragraphs [1] to [3], wherein the piezoelectric/electrostrictive element is formed by a film forming technology, and obtained by disposing a constituting material of the piezoelectric/electrostrictive element on the outer surface of the thin diaphragm portion, and thermally treating the constituting material to fix the constituting material onto the outer surface of the thin diaphragm portion.

According to the present invention, there is provided the piezoelectric/electrostrictive device which effectively prevents the damp of the vibration of the thin diaphragm portion and which is superior in response while maintaining the displacement (amplitude) to be high and in which the high-precision (high-resolution, high-sensitivity) detection is possible.

DESCRIPTION OF THE PREFERRED EMBODIMENT

Embodiments of a piezoelectric/electrostrictive device of the present invention will be described hereinafter with reference to the drawings.

Figure 1:
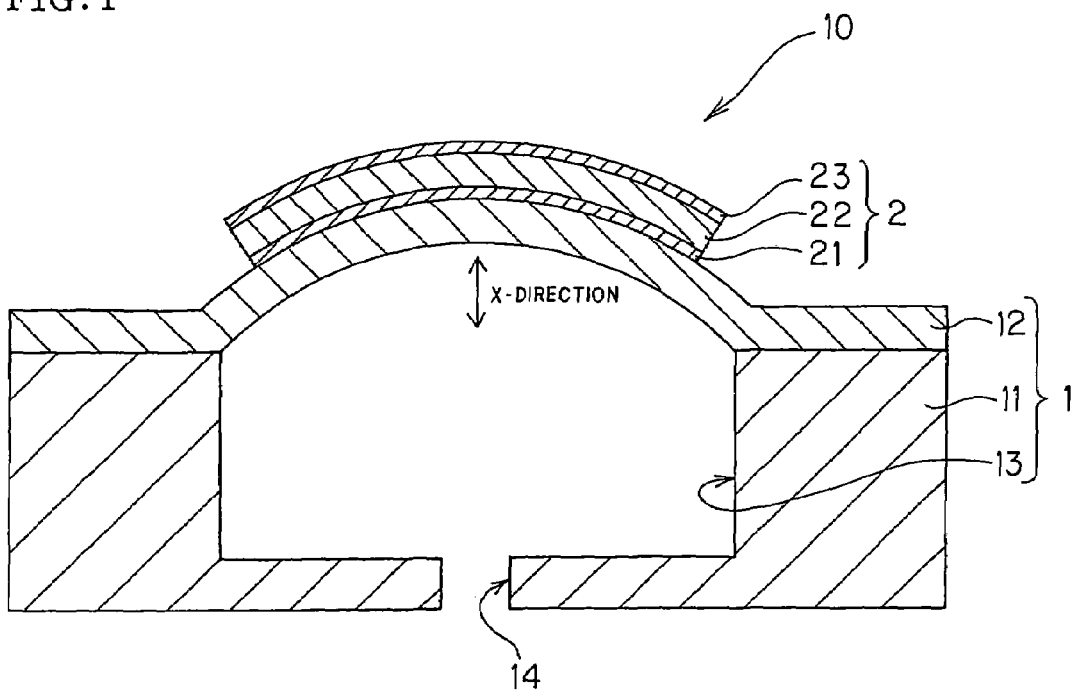
FIG. 1 is an explanatory view schematically showing one embodiment of a piezoelectric/electrostrictive device of the present invention.
Figure 2:
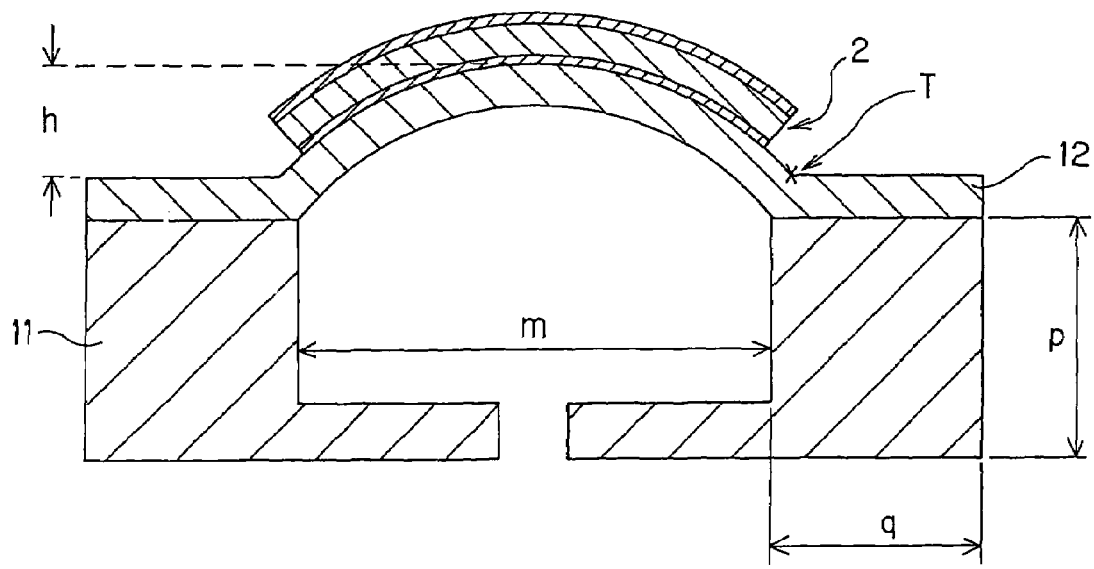
FIG. 2 is an explanatory view schematically showing shape and dimension relations in the embodiment shown in FIG. 1.

FIG. 1 is an explanatory view schematically showing one embodiment of the piezoelectric/electrostrictive device of the present invention, and FIG. 2 is an explanatory view schematically showing a shape and dimension relation in one embodiment of the piezoelectric/electrostrictive device.

As shown in FIGS. 1 and 2, according to the present embodiment, the piezoelectric/electrostrictive device comprises: a ceramic substrate 1 having thick portions 11, a thin diaphragm portion 12 mounted integrally on end surfaces of the thick portions 11, and a cavity 13 formed by the thick portions 11 and the thin diaphragm portion 12 in such a manner as to communicate with the outside; and a piezoelectric/electrostrictive element 2 having a layered structure fixed to an outer surface of the thin diaphragm portion 12 of the ceramic substrate 1 and including a lower electrode 21, a piezoelectric/electrostrictive film 22, and an upper electrode 23. The thin diaphragm portion 12 of the ceramic substrate 1 can vibrate in conjunction with driving of the piezoelectric/electrostrictive element 2 in a piezoelectric/electrostrictive device 10. The following shape and dimension relations defined in (A) to (C) are satisfied:

(A) The thin diaphragm portion 12 has an outward protruding arch shape, and an outward protrusion height (h) of the arch shape is 5 to 50 μm;

(B) A mounting width (m) of the thin diaphragm portion is 600 to 2000 μm; and (C) A ratio (height/width) of a height of the thick portion to a width thereof is 0.25 to 3.

Figure 3A:
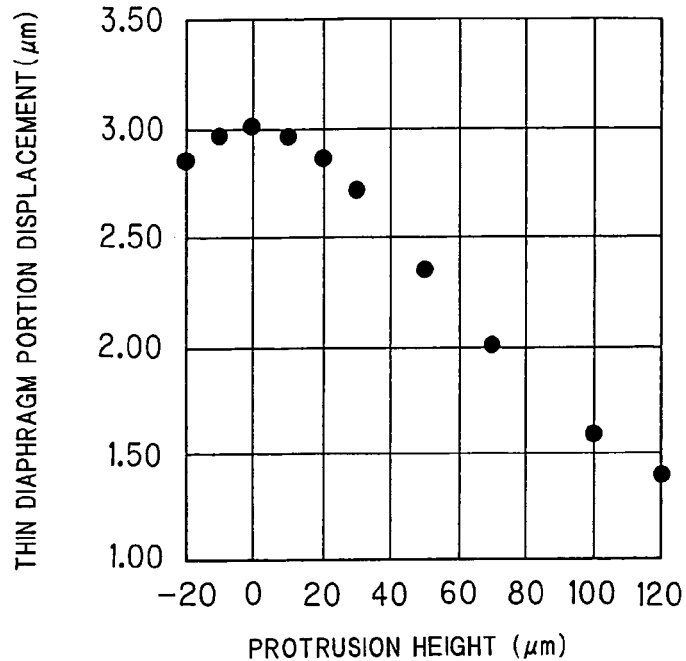
FIG. 3(a) is a graph showing a relation between a protrusion height (h) of a thin diaphragm portion and displacement of the thin diaphragm portion.
Figure 3B:
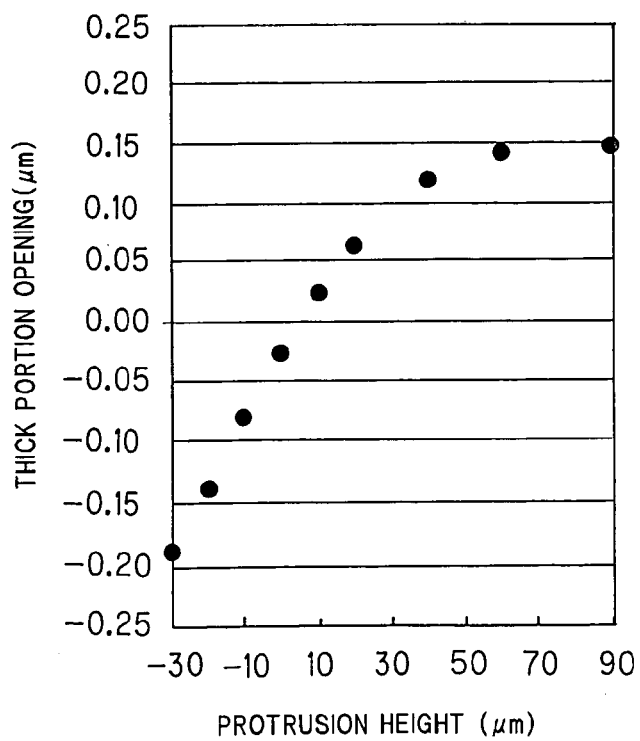
FIG. 3(b) is a graph showing the protrusion height (h) of the thin diaphragm portion and an opening of a thick portion.

In the present embodiment, as described above, (A) the shape of the thin diaphragm portion 12 is the outward protruding arch shape, and the outward protrusion height (h) of the arch shape needs to be 5 to 50 μm, preferably 5 to 30 μm. With the outward protruding arch shape, a strain or a stress generated in the piezoelectric/electrostrictive element 2 can be efficiently converted into displacement. That is, when the piezoelectric/electrostrictive element 2 formed on the outer surface of the thin diaphragm portion 12 having the outward protruding arch shape is driven, the element is displaced in a direction (X-direction) vertical to the outer surface of the thin diaphragm portion 12. Therefore, the thin diaphragm portion 12 of the ceramic substrate 1 also vibrates in the direction (X-direction) vertical to the outer surface in conjunction with the driving of the piezoelectric/electrostrictive element 2 while changing an internal volume of the cavity 13. However, when the piezoelectric/electrostrictive element 2 (specifically, at least the lower electrode 21 and the piezoelectric/electrostrictive film 22) is formed on the outwardly protruding arched outer surface of the thin diaphragm portion 12, it is possible to enhance effectively rigidity of a portion of the thin diaphragm portion 12 in which the piezoelectric/electrostrictive element 2 is formed. Since the thin diaphragm portion 12 has the outward protruding arch shape, a mechanical strength can be enhanced with respect to a pressing force from the outer surface of the thin diaphragm portion 12. Furthermore, it is also possible to increase natural frequencies and response speed of the thin diaphragm portion 12 provided with the piezoelectric/electrostrictive element 2. When the outward protrusion height (h) of the arch shape deviates from a range of 5 to 50 μm, as shown in FIGS. 3(a), (b), it is difficult to secure a sufficiently large displacement required for outputting an intense clear signal, and a vibration mode which does not easily damp. It is to be noted that when the protrusion height (h) increases, the displacement is reduced, and unnecessary deformation easily occurs. Therefore, an S/N ratio of an output signal is reduced. However, the protrusion height (h) is in a range of 5 to 30 μm, a clear output signal can be preferably securely obtained. That is, FIG. 3(a) is a graph showing a relation between the protrusion height (h) of the thin diaphragm portion and the displacement of the thin diaphragm portion. It is shown that when the protrusion height (h) deviates from the range of 5 to 50 μm, the displacement is rapidly reduced. FIG. 3(b) is a graph showing a relation between the protrusion height (h) of the thin diaphragm portion and an opening of the thick portion. When the protrusion height (h) is less than 5 μm, the thick portion falls on a cavity side. When the amount exceeds 50 μm, the rigidity of the thin diaphragm portion decreases, and there is not obtained such a desired deformation that a center of the thin diaphragm portion corresponds to a peak of the deformation (e.g., a initial mode is obtained as to the vibration) (this is shown by the thick portion whose opening does not change, when the protrusion height (h) exceeds 50 μm). It is to be noted that the "opening of the thick portion" means an amount by which a reference point T shown in FIG. 2 moves in a width (q) direction of the thick portion 11. The amount is positive in a case where the point moves outward (to the right side in the figure) in the width (q) direction. The amount is negative in a case where the point moves inwards (to the left side in the figure) in the width (q) direction.

Figure 4A:
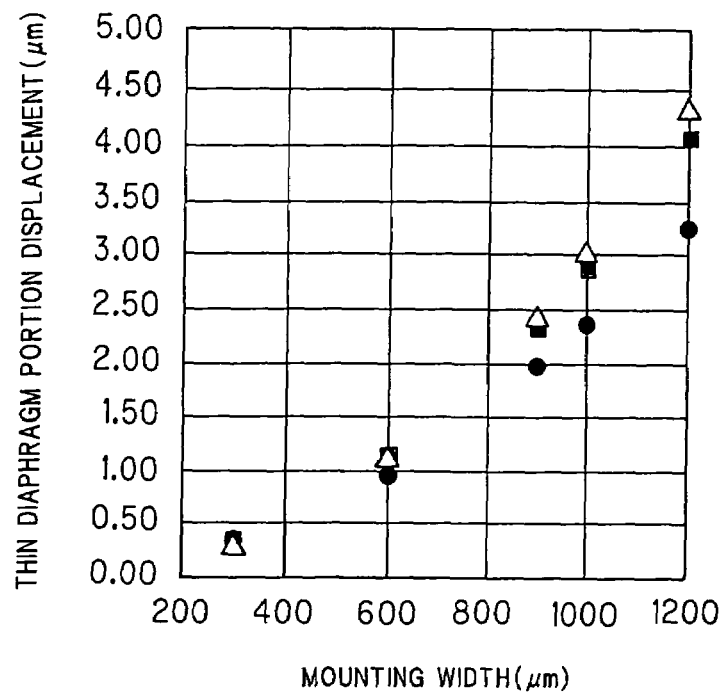
FIG. 4(a) is a graph showing a relation between a mounting width (m) of the thin diaphragm portion and displacement of the thin diaphragm portion.
Figure 4B:
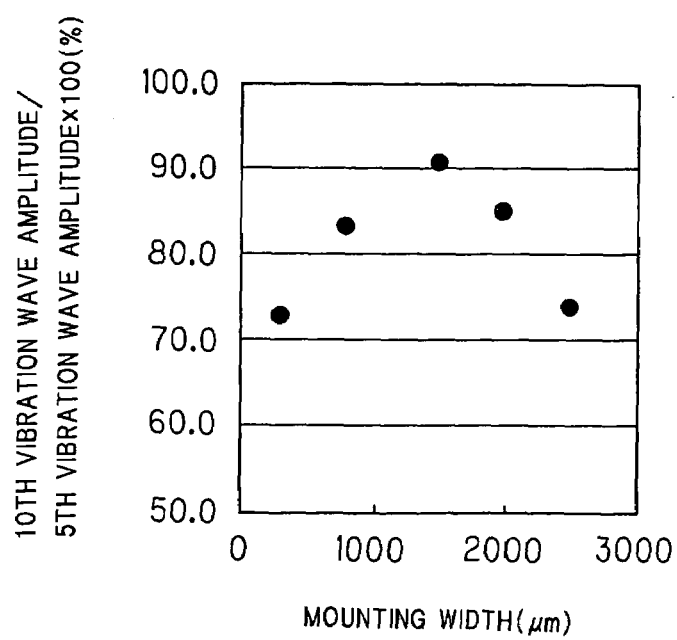
FIG. 4(b) is a graph showing a relation between the mounting width (m) of the thin diaphragm portion and a ratio of a vibration wave amplitude.

Moreover, (B) the mounting width (m) of the thin diaphragm portion needs to be 600 to 2000 μm, preferably 600 to 1500 μm. Here, the mounting width (m) of the thin diaphragm portion means a length of the cavity 13 in a short direction. The width means: for example, a diameter of a circle in a case where a shape (sectional shape vertical to the X-direction) of the cavity 13 is the circle; a length of a short side of a rectangle in a case where the shape is the rectangle; or a length corresponding to that of a short axis of an ellipse in a case where the shape is the ellipse. As shown in FIGS. 4(a), (b), when the mounting width (m) of the thin diaphragm portion is less than 600 μm, a channel resistance increases, and the displacement is reduced. When the width exceeds 2000 μm, the rigidity of the thin diaphragm portion is lowered, the natural frequencies decreases, and the vibration easily damps. Therefore, any sufficient output signal is not obtained. It is to be noted that when the mounting width (m) exceeds 1500 μm, the unnecessary deformation easily occurs. Therefore, the S/N ratio of the output signal sometimes decreases (the unnecessary deformation easily occurs up to the mounting width (m) of 2000 μm, but this is within an allowable range). However, when the mounting width (m) is in a range of 600 to 1500 μm, the clear output signal can be preferably securely obtained. That is, FIG. 4(a) is a graph showing a relation between the mounting width (m) of the thin diaphragm portion and the displacement of the thin diaphragm portion. It is shown that when the mounting width (m) is less than 600 μm, the displacement is reduced, and any sufficient output signal is not obtained. FIG. 4(b) is a graph showing a relation between the mounting width (m) of the thin diaphragm portion and the damp. It is shown that when the mounting width (m) exceeds 2000 μm, the natural frequencies decreases owing to a decrease of the rigidity of the thin diaphragm portion, the vibration is easily influenced by the unnecessary vibration mode, and easily damps, and any sufficient output signal is not obtained. It is also shown that when the mounting width (m) is less than 600 μm, a mass of the thin diaphragm portion is reduced, the vibration is easily influenced by constraints in opposite end portions, and therefore easily damps, and any sufficient output signal is not obtained. It is to be noted that in the graph of FIG. 4(a), a case where the protrusion height (h) of the thin diaphragm portion is 50 μm is shown by a point of ○, a case where the amount is 20 μm is shown by □, and a case where the amount is 0 μm is shown by △, respectively. A typical measure of the damp in the ordinate of FIG. 4(b) is represented by a value of a ratio of a vibration wave amplitude= [(tenth vibration wave amplitude/fifth vibration wave amplitude)×100(%)]. Here, the fifth vibration wave amplitude means a fifth amplitude among the amplitudes generated by a free vibration, and the tenth vibration wave amplitude means a tenth amplitude among the amplitudes generated by the free vibration. When the fifth vibration wave amplitude is represented by V5, and the tenth vibration wave amplitude is represented by V10, the value of the ratio of the vibration wave amplitude is represented by $$[(V10/V5)\times 100(\%)].$$

Figure 5A:
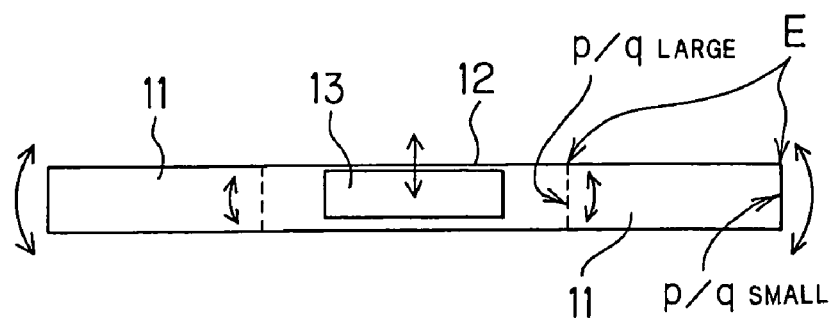
FIG. 5(a) is an explanatory view schematically showing that a vibration of a device end portion E in an X-direction is largely excited, when a ratio (height (p)/width (q)) of the height (p) to the width (q) of the thick portion is small (the vibration of the device end portion E is little excited, when the ratio is large)
Figure 5B:
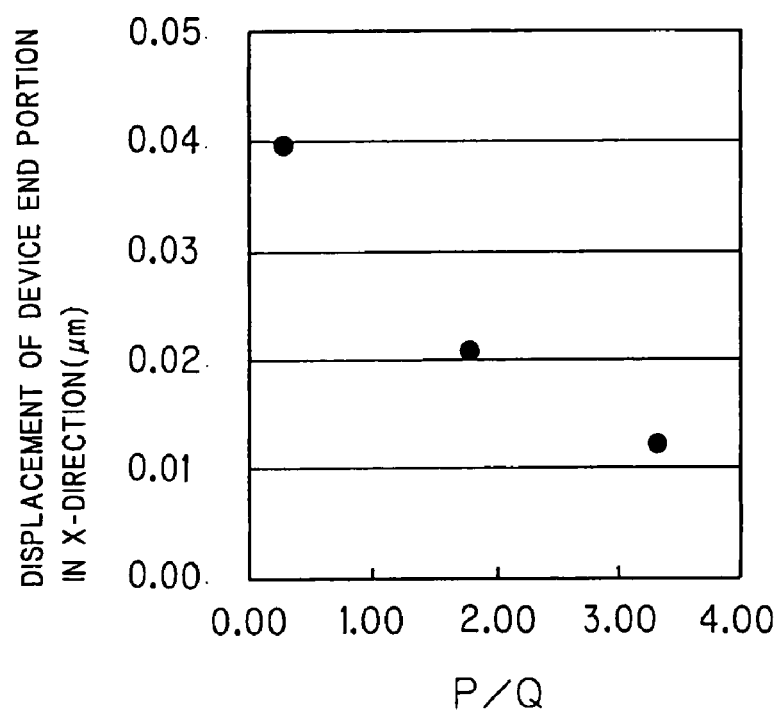
FIG. 5(b) is a graph showing a relation between the height (p)/width (q) and the displacement of the device end portion E in the X-direction.
Figure 6A:
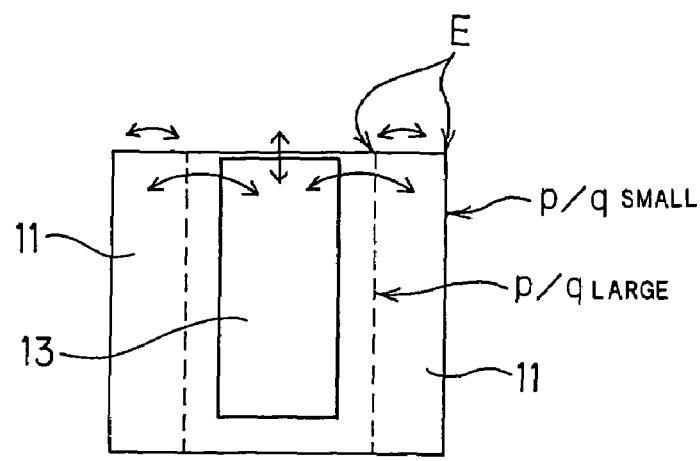
FIG. 6(a) is an explanatory view schematically showing that the vibration of the device end portion E in a width direction is largely excited, when the height (p)/width (q) is large (the vibration of the device end portion E in the width direction is little excited, when the ratio is small)
Figure 6B:
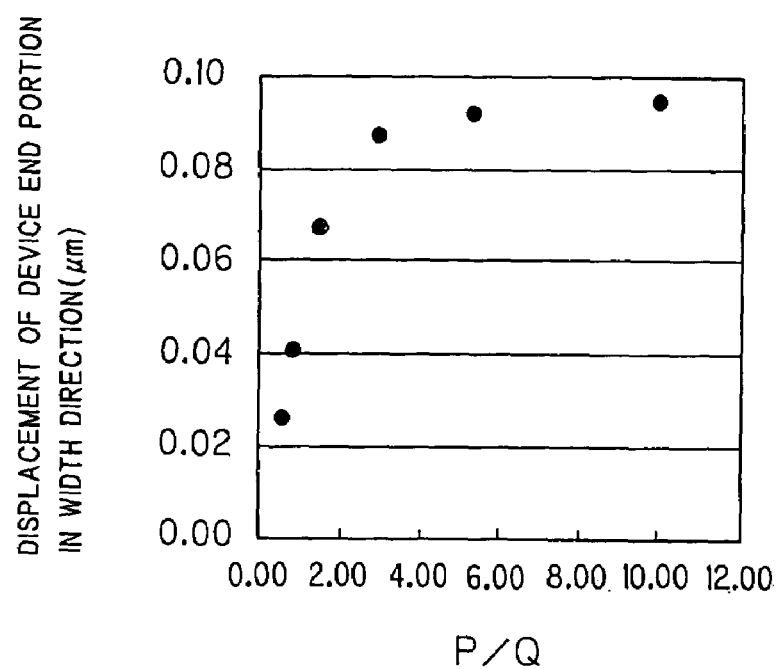
FIG. 6(b) is a graph showing a relation between the height (p)/width (q) and the displacement of the device end portion E in the width direction.

Moreover, (C) the ratio (height (p)/width (q)) of the height (p) to the width (q) of the thick portion needs to be 0.25 to 3, preferably 0.25 to 1.5. As shown in FIGS. 5(a), (b), and FIGS. 6(a), (b), when this ratio is less than 0.25, the vibration of the device end portion E in the X-direction due to the driving of the thin diaphragm portion is easily excited, and the damp of the vibration of the thin diaphragm portion is caused. When the ratio has a large value exceeding 3, the vibration of the device end portion E in the width direction is easily excited, and the damp of the vibration of the thin diaphragm portion is caused during the driving of the thin diaphragm portion. It is to be noted that when the ratio (height (p)/width (q)) exceeds 1.5, deformation of a high order is easily generated in the thick portion, and the S/N ratio of the output signal is sometimes reduced. However, when the ratio (height (p)/width (q)) is in a range of 0.25 to 1.5, the clear output signal can be preferably securely obtained. That is, FIG. 5(a) is an explanatory view schematically showing that when the ratio (height (p)/width (q)) of the height (p) to the width (q) of the thick portion is small (shown by a solid line in the figure), the X-direction vibration of the device end portion E is largely excited (when the ratio is large (shown by a broken line in the figure), the X-direction vibration of the device end portion E is little excited). FIG. 5(b) is a graph showing a relation between the height (p)/width (q) and the displacement of the device end portion E in the X-direction (see FIG. 1). It is shown that when the height (p)/width (q) is less than 0.25, the X-direction vibration of the device end portion E is excited, and the thin diaphragm portion vibration is damped. FIG. 6(a) is an explanatory view schematically showing that when the height (p)/width (q) has a large value exceeding 3 (shown by a broken line in the figure), the vibration of the device end portion E in the width direction is largely excited (when the ratio is small (shown by a solid line in the figure, the vibration of the device end portion E in the width direction is little excited). FIG. 6(b) is a graph showing a relation between the height (p)/width (q) and the displacement of the device end portion E in the width direction. It is shown that when the height (p)/width (q) exceeds 3, the thick portion is deformed, and the thin diaphragm portion vibration is damped.

Since the piezoelectric/electrostrictive device of the present embodiment has the above-described constitution, the damp of the vibration of the thin diaphragm portion is effectively prevented, the displacement (amplitude) is maintained to be high, response is superior, and high-precision (high-resolution, high-sensitivity) detection is possible.

Figure 7:
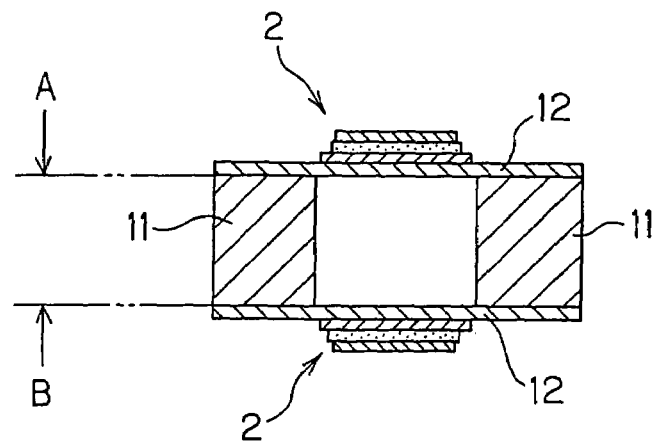
FIG. 7 is an explanatory view schematically showing another embodiment of the piezoelectric/electrostrictive device of the present invention, in which one thin diaphragm portion and one piezoelectric/electrostrictive element are disposed on each of opposite end surfaces (a first plane and a second plane parallel to the first plane) of each of two thick portions.
Figure 8:
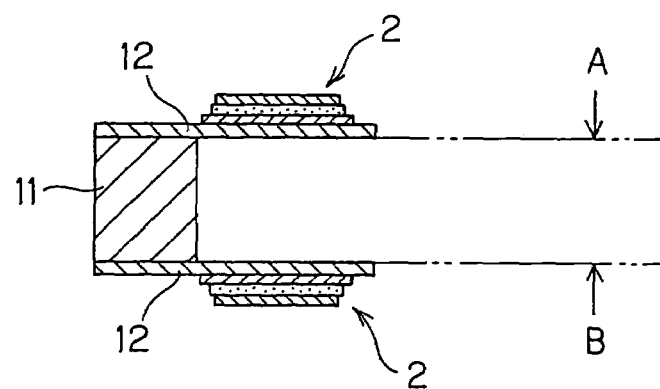
FIG. 8 is an explanatory view schematically showing still another embodiment of the piezoelectric/electrostrictive device of the present invention, in which one thin diaphragm portion and one piezoelectric/electrostrictive element are disposed in a cantilever beam state on each of the opposite end surfaces (the first plane and the second plane parallel to the first plane) of one thick portion.
Figure 9:
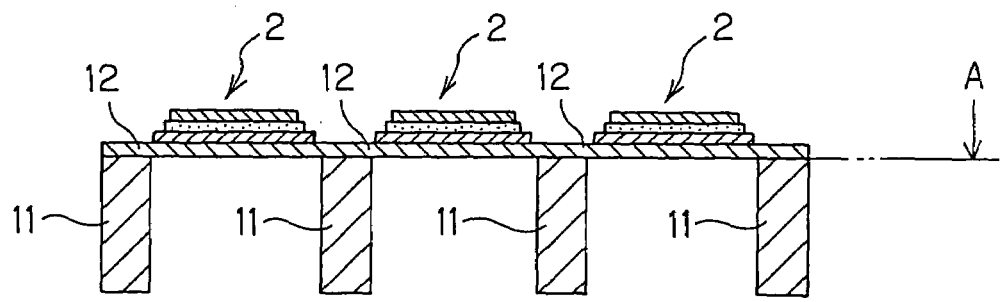
FIG. 9 is an explanatory view schematically showing a further embodiment of the piezoelectric/electrostrictive device of the present invention, in which three thin diaphragm portions and three piezoelectric/electrostrictive elements are disposed on one end surface (the first plane) of each of four thick portions.
Figure 10:
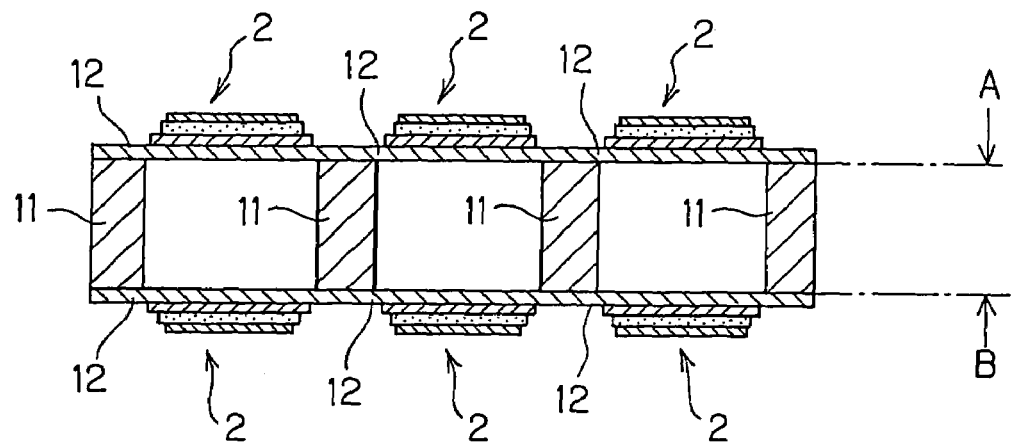
FIG. 10 is an explanatory view schematically showing a further embodiment of the piezoelectric/electrostrictive device of the present invention, in which three thin diaphragm portions and three piezoelectric/electrostrictive elements are disposed on each of the opposite end surfaces (the first plane and the second plane parallel to the first plane) of each of four thick portions, that is, six thin diaphragm portions and six piezoelectric/electrostrictive elements are disposed in total.

In the embodiment shown in FIGS. 1 and 2, it has been described that there are disposed one thin diaphragm portion 12 integrally mounted on end surfaces (first plane A) of two thick portions 11, and one piezoelectric/electrostrictive element 2 fixed to the outer surface of the thin diaphragm portion 12. However, as shown in FIGS. 7 to 10, as other embodiments, the thin diaphragm portion 12 and the piezoelectric/electrostrictive element 2 may be disposed on the first plane A and/or a second plane B parallel to the first plane A. FIG. 7 shows a case where one thin diaphragm portion 12 and one piezoelectric/electrostrictive element 2 are disposed on each of opposite end surfaces (the first plane A and a second plane B parallel to the first plane A) of each of two thick portions 11. FIG. 8 shows a case where one thin diaphragm portion 12 and one piezoelectric/electrostrictive element 2 are disposed in a cantilever beam state on each of the opposite end surfaces (the first plane A and the second plane B parallel to the first plane A) of one thick portion 11. FIG. 9 shows a case where three thin diaphragm portions 12 and three piezoelectric/electrostrictive elements 2 are disposed on one end surface (the first plane A) of each of four thick portions 11. FIG. 10 shows a case where three thin diaphragm portions 12 and three piezoelectric/electrostrictive elements 2 are disposed on each of the opposite end surfaces (the first plane A and the second plane B parallel to the first plane A) of each of four thick portions 11, that is, six thin diaphragm portions and six piezoelectric/electrostrictive elements are disposed in total.

Figure 11:
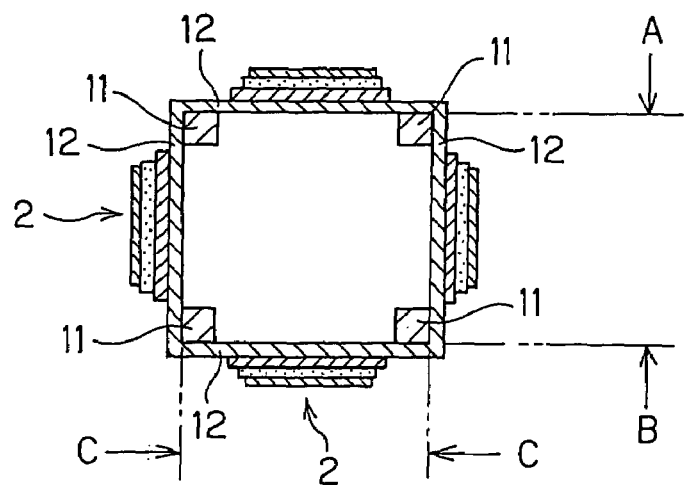
FIG. 11 is an explanatory view schematically showing a further embodiment of the piezoelectric/electrostrictive device of the present invention, in which one thin diaphragm portion and one piezoelectric/electrostrictive element are disposed on each of end surfaces parallel to each other and end surfaces vertical to each other (the first plane, the second plane parallel to the first plane, and third planes (there are two planes) vertical to the first plane) of each of four thick portions, that is, four thin diaphragm portions and four piezoelectric/electrostrictive elements are disposed in total.

Moreover, as shown in FIG. 11, as another embodiment, in a case where there are disposed two or more thin diaphragm portions 12 and two or more piezoelectric/electrostrictive elements 2 fixed onto the outer surfaces of the thin diaphragm portions 12, the thin diaphragm portions and the piezoelectric/electrostrictive elements may be disposed on the first plane A, the second plane B parallel to the first plane A and/or third planes C vertical to the first plane A). FIG. 11 shows a case where one thin diaphragm portion 12 and one piezoelectric/electrostrictive element 2 are disposed on each of the end surfaces parallel to each other and the end surfaces vertical to each other (the first plane A, the second plane B parallel to the first plane A, and third planes C (there are two planes C) vertical to the first plane A) of four thick portions 11, that is, four thin diaphragm portions and four piezoelectric/electrostrictive elements are disposed in total.

It is to be noted that the graphs shown in FIGS. 3 to 6 are prepared based on values obtained by vibrating the thin diaphragm portions 12 independently of each other in the piezoelectric/electrostrictive device constituted to have two or more thin diaphragm portions as shown in FIGS. 7 to 11. It is to be noted that these graphs show one example, and are prepared based on the device having the dimension relation in which the thickness of the thin diaphragm portion is 14 μm, the protrusion height is 20 μm, the mounting width is 1500 μm, the height of the thick portion is 800 μm, and the width of the thick portion is 800 μm, and having two thin diaphragm portions symmetrically disposed as shown in FIG. 7.

In the present embodiment, the piezoelectric/electrostrictive element 2 is formed in a film forming technology. A constituting material of the piezoelectric/electrostrictive element 2 is disposed on the outer surface of the thin diaphragm portion 12, thereafter thermally treated, and fixed onto the outer surface of the thin diaphragm portion 12 to thereby obtain the element. In this case, bonding properties among layers can be enhanced, and effects can be most effectively fulfilled.

Each constituting element for use in the piezoelectric/electrostrictive device of the present invention will be described hereinafter specifically.

A material of the ceramic substrate 1 for use in the present invention preferably has heat resistance, chemical stability, and insulating property. This is because the above-described thermal treatment is sometimes performed in fixing to the outer surface the piezoelectric/electrostrictive element 2 (including the lower electrode 21, the piezoelectric/electrostrictive film 22, and the upper electrode 23) described later. In a case where the piezoelectric/electrostrictive device is used as a sensor element for detecting properties of a liquid, the liquid sometimes has conductivity or corrosive property.

From such viewpoint, examples of a ceramic preferably for use as the constituting material of the ceramic substrate 1 include stabilized zirconium oxide, aluminum oxide, magnesium oxide, mullite, aluminum nitride, silicon nitride, and glass. Above all, stabilized zirconium oxide is more preferable because it can retain a high mechanical strength and is superior in toughness even in a case where the thin diaphragm portion 12 is constituted to be thin.

A thickness of the thin diaphragm portion 12 of the ceramic substrate 1 is usually 100 μm or less, preferably 30 μm or less, more preferably 15 μm or less lest it should restrict the driving of the piezoelectric/electrostrictive element 2.

Moreover, an outer shape of the thin diaphragm portion 12 may be any one of rectangle, square, triangle, ellipse, and perfect circle as long as the shape is adapted to a frame or U-shaped article shape of the thick portion 11. The rectangular, elongated circular, or elliptic shape is preferable in a case where the cavity 13 is formed by the thick portion 11 and the thin diaphragm portion 12, and a through hole 14 is formed in order to supply or discharge a fluid to be measured with respect to the cavity 13 via the through hole 14 as shown in FIG. 1. The rectangular, elongated circular, or elliptic shape having an aspect ratio of 1.5 or more is more preferable in order to obtain an ideal vibration (displacement). The thick portion may be provided with a pore or a hole for use in attaching or positioning the device.

The piezoelectric/electrostrictive element 2 (including the lower electrode 21, the piezoelectric/electrostrictive film 22, and the upper electrode 23) for use in the present invention is fixed to the outer surface of the thin diaphragm portion 12. The lower electrode 21 constituting the piezoelectric/electrostrictive element 2 is formed into a size nearly equal to a size into which the piezoelectric/electrostrictive film 22 is to be formed on the outer surface of the thin diaphragm portion 12. In this case, a width of the lower electrode 21 in the short direction may be set to be larger than that of the thin diaphragm portion 12, and smaller than that of the piezoelectric/electrostrictive film 22.

An auxiliary electrode (not shown) may be disposed in order to enhance reliability of electric connection of the upper electrode. The auxiliary electrode may be formed continuously in a predetermined position on the outer surface of the thin diaphragm portion 12. The lower electrode 21 and the auxiliary electrode may be constituted of different materials or the same material, and the materials are preferably conductive materials having good bondability with respect to either of the ceramic substrate 1 and the piezoelectric/electrostrictive film 22. Typical examples of the electrode material include a material containing as a main component platinum, palladium, rhodium, silver, or an alloy of them. Especially in a case where the thermal treatment for sintering the material is performed in forming the piezoelectric/electrostrictive film 22, the electrode material is more preferable which contains platinum or an alloy of platinum as the main component. Various types of known film forming technologies can be used in forming the lower electrode 21 and the auxiliary electrode. Examples of such film forming technology include: thin film forming technologies such as ion beam, sputtering, vacuum evaporation, CVD, ion plating, and plating; and thick film forming technologies such as screen printing, spraying, and dipping. Above all, a sputtering process and a screen printing process are preferable.

A bonding layer (not shown) may be disposed between the lower electrode 21 and the auxiliary electrode to connect the piezoelectric/electrostrictive film 22 to the thin diaphragm portion 12. In this case, the bonding layer is formed prior to formation of the piezoelectric/electrostrictive film 22. When such bonding layer is formed, the rigidity of the piezoelectric/electrostrictive element 2 becomes uniform on the outer surface of the thin diaphragm portion 12, and this is preferable for obtaining an ideal vibration (displacement). A material of the bonding layer may be either of organic and inorganic materials as long as an adhering or bondability is high with respect to either of the piezoelectric/electrostrictive film 22 and the ceramic substrate 1. A thermal expansion coefficient of the material constituting the bonding layer preferably has an intermediate value between the thermal expansion coefficients of the constituting materials of the ceramic substrate 1 and the piezoelectric/electrostrictive film 22, so that the bonding having high reliability is obtained. In a case where the piezoelectric/electrostrictive film 22 is thermally treated to be sintered, a preferable material is a material obtained by adding a micro amount of glass component to the constituting material of the piezoelectric/electrostrictive film 22, or a glass material having a softening point which is not less than a thermal treatment temperature of the piezoelectric/electrostrictive film 22. Because the material has a high adhering or bondability with respect to each of the piezoelectric/electrostrictive film 22 and the ceramic substrate 1.

Moreover, the constituting material of the piezoelectric/electrostrictive film 22 described later is $(Bi_{0.5}Na_{0.5})TiO_3$ or a material containing this as the main component, or $(1-x)(Bi_{0.5}Na_{0.5})TiO_3\text{-}xKNbO_3$ (x is a molar fraction in a range of $0 \leq x \leq 0.06$) or a material containing this as the main component. In this case, the preferable material of the bonding layer is a material obtained by adding a micro amount of the glass component to a material containing as the main component $(1-x)(Bi_{0.5}Na_{0.5})TiO_3\text{-}xKNbO_3$ (x is the molar fraction in a range of $0 \leq x \leq 0.5$). Because the material has the high adhering property with respect to either of the piezoelectric/electrostrictive film 22 and the ceramic substrate 1, and can suppress an adverse influence on the piezoelectric/electrostrictive film 22 and the ceramic substrate 1 during the thermal treatment. That is, when the bonding layer is formed of $(1-x)(Bi_{0.5}Na_{0.5})TiO_3\text{-}xKNbO_3$ (x is the molar fraction in a range of $0 \leq x \leq 0.5$) to which a micro amount of glass component has been added, the layer has a component similar to that of the piezoelectric/electrostrictive film 22. Therefore, the layer obtains the high adhering property to the piezoelectric/electrostrictive film 22. This eliminates a problem which easily occurs owing to diffusion of different types of elements in a case where glass is used alone. Since $KNbO_3$ is contained, reactivity to the ceramic substrate 1 is high, and firm bonding is possible. When the main component of the bonding layer is $(1-x)(Bi_{0.5}Na_{0.5})TiO_3\text{-}xKNbO_3$ (x is the molar fraction in a range of $0.08 \leq x \leq 0.5$), a piezoelectric property is hardly shown. Therefore, any vibration (displacement), stress or the like is not generated with respect to an electric field generated in the lower electrode 21 and the auxiliary electrode during use, and stable device properties can be obtained.

A usual thick film forming technology is used in forming the bonding layer. Especially, a stamping process or the screen printing process is used. In a case where a size of a portion to be formed is about several tens to several hundreds of μm, an ink jet process is preferably used. When the thermal treatment of the bonding layer is required, the layer may be thermally treated prior to or simultaneously with the formation of the piezoelectric/electrostrictive film 22.

The piezoelectric/electrostrictive film 22 constituting the piezoelectric/electrostrictive element 2 is formed in such a manner as to be laid on the outer surface of the lower electrode 21 (the auxiliary electrode and the bonding layer if necessary). There is not any special restriction on the constituting material of the piezoelectric/electrostrictive film 22 as long as the material exhibits a piezoelectric/electrostrictive effect. Examples of the material include: lead-based ceramic piezoelectric/electrostrictive materials such as lead zirconate, lead titanate, and lead zirconate titanate (PZT); barium titanate and a barium titanate based ceramic ferroelectric containing barium titanate as the main component; a polymer piezoelectric article represented by polyvinylidene fluoride (PVDF); a Bi-based ceramic piezoelectric article represented by $(Bi_{0.5}Na_{0.5})TiO_3$; and a Bi layered ceramic. A mixture of these materials, a dissolved article, a material obtained by adding an additive to any one of the materials and the like having improved piezoelectric/electrostrictive properties may be used.

The PZT-based ceramic piezoelectric/electrostrictive material is preferably used as a material of a sensor having a high piezoelectric property and capable of performing the high-sensitive detection. Above all, the piezoelectric/electrostrictive film is constituted of a material containing as the main component at least one selected from the group consisting of lead titanate, lead zirconate, magnesium lead niobate, and nickel lead niobate. This is preferable because reactivity to the constituting material of the ceramic substrate 1 is low, segregation of the component being thermally treated does not often occur, a treatment for retaining the composition is smoothly performed, and targeted composition and crystal structure are easily obtained.

In a case where platinum or an alloy containing platinum as the main component is used as the constituting materials of the lower electrode 21 and the auxiliary electrode, $(Bi_{0.5}Na_{0.5})TiO_3$ or a material containing this as the main component is preferably used, because the bondability to these electrodes is higher, fluctuations of the properties of the piezoelectric/electrostrictive device are reduced, and high reliability is obtained. Above all, (1-x) $(Bi_{0.5}Na_{0.5})TiO_3$-$xKNbO_3$ (x is the molar fraction in a range of $0 \leq x \leq 0.06$) or a material containing this as the main component is preferable because the material has a comparatively high piezoelectric property. Various types of known film forming technologies are usable in forming the piezoelectric/electrostrictive film 22 in the same manner as in the lower electrode 21 and the auxiliary electrode. Above all, the screen printing is preferable from a viewpoint of cost reduction.

The piezoelectric/electrostrictive film 22 formed by the above-described method is thermally treated if necessary, and integrated with the lower electrode 21 (the auxiliary electrode and the bonding layer if necessary). In a case where the bondability of the piezoelectric/electrostrictive film 22 to the lower electrode 21 (the auxiliary electrode and the bonding layer if necessary) needs to be strengthened more in order to suppress the fluctuations of the properties of the piezoelectric/electrostrictive device and enhance the reliability, $(Bi_{0.5}Na_{0.5})TiO_3$ or a material containing this as the main component is used. Above all, (1-x) $(Bi_{0.5}Na_{0.5})TiO_3$-$xKNbO_3$ (x is the molar fraction in a range of $0 \leq x \leq 0.06$) or the material containing this as the main component is used, and preferably thermally treated at a temperature of 900 to 1400° C., preferably 1000 to 1300° C. This also applies to a case where the PZT-based ceramic piezoelectric/electrostrictive material is used. In this case, the thermal treatment is preferably performed while controlling an atmosphere together with an evaporation source of the ceramic piezoelectric/electrostrictive material lest the piezoelectric/electrostrictive film 22 should be unstable at the high temperature.

The upper electrode 23 constituting the piezoelectric/electrostrictive element 2 is formed in such a manner as to be laid on the outer surface of the piezoelectric/electrostrictive film 22 formed as described above. As the material of the upper electrode 23, a conductive material is used which has a high bondability to the piezoelectric/electrostrictive film 22, and the upper electrode is formed by a film forming process similar to that of the lower electrode 21 or the auxiliary electrode. Furthermore, the upper electrode 23 is thermally treated if necessary after film formation, and bonded to the piezoelectric/electrostrictive film 22 and the auxiliary electrode to constitute an integral structure. Such thermal treatment is not necessarily required in the same manner as in the lower electrode 21. To realize ideal driving (displacement), the rigidity of the upper electrode is preferably uniform on the thin diaphragm portion 12. For this, it is more preferable to integrate the lower electrode 21, the piezoelectric/electrostrictive film 22, and the upper electrode 23 with the thin diaphragm portion 12 by the thermal treatment than to bond them by use of an adhesive. To obtain a sharp peak, a shape of the upper electrode 23 in a width direction is preferably linearly symmetric. When the electrode is formed to be symmetric, desirable vibration only can be emphasized in vibrating the thin diaphragm portion. Furthermore, a center of the upper electrode 23 is preferably matched with that of the thin diaphragm portion 12. A deviation from the center in a length direction of the thin diaphragm portion 12 is preferably 5% or less with respect to a length of the thin diaphragm portion 12. The deviation in the width direction is preferably 10% or less with respect to the width of the thin diaphragm portion 12. It is to be noted that a ratio of an area effective for driving the upper electrode 23 to an area of the thin diaphragm portion 12 is preferably 15 to 40%. In this range, a necessary vibration can be obtained for the detecting, and the rigidity advantageous for the vibrating can be obtained.

It is to be noted that when the lower electrode 21, the bonding layer if necessary, the piezoelectric/electrostrictive film 22, and the upper electrode 23 are bonded by the thermal treatment, the thermal treatment may be performed every time each of them is formed, or they may be simultaneously thermally treated after the respective films are formed successively. During the thermal treatment, an appropriate thermal treatment temperature is preferably selected in order to obtain the satisfactory bondability or suppress changes of the properties due to diffusion of the constituting element. FIG. 1 shows a case where the through hole 14 is formed in the cavity 13, but there is not any special restriction, and the structure of the cavity 13 or the like where the piezoelectric/electrostrictive device comes into contact with the fluid may be a simple cavity structure. Furthermore, an end portion of the piezoelectric/electrostrictive film 22 in the length direction may be set to have a length that does not exceed that of the thin diaphragm portion 12, and the piezoelectric/electrostrictive film 22 may not be extended to the thick portion 11.

EXAMPLE

The present invention will be described hereinafter in accordance with examples in more detail, but the present invention is not limited to these examples.

EXAMPLE 1

There was prepared a piezoelectric/electrostrictive device comprising one thin diaphragm portion (thickness of 14 µm, protrusion height of 20 µm, mounting width of 1500 µm), two thick portions (thick portion height of 800 µm, thick portion width of 800 µm, (height of thick portion/width of thick portion)=1.0), and one piezoelectric/electrostrictive element (lower electrode thickness of 4 µm, piezoelectric/electrostrictive film thickness of 20 µm, upper electrode thickness of 0.5 µm). It is to be noted that the protrusion height of an arch shape in the thin diaphragm portion constituting the device obtained in Example 1 was confirmed by measuring a cut surface of the piezoelectric/electrostrictive device with an optical measurement microscope.

(Measurement of Properties of Thin Diaphragm Portion)

As to a vibrating property in the thin diaphragm portion constituting the piezoelectric/electrostrictive device obtained in Example 1, a moment in which a voltage was interrupted from a state in which the voltage of 50 V was applied to the piezoelectric/electrostrictive device was regarded as an origin of time. A change of a position of the thin diaphragm portion being vibrated at that time with an elapse of time was measured by measuring a waveform for 20 cycles with a laser Doppler measurement unit. As a result, a fifth vibration wave amplitude (V5) was 2.70 μm, a tenth vibration wave amplitude (V10) was 2.45 μm, and a value of a ratio of the vibration wave amplitude=[(V10/V5)×100(%)] was 90.7%. It was found that damp of the vibration was small.

COMPARATIVE EXAMPLE 1

A device was obtained in the same manner as in Example 1 except that a thin diaphragm portion was not formed into an arch shape (protrusion height was set to 0 μm) in Comparative Example 1, and a vibrating property was similarly measured. As a result, a fifth vibration wave amplitude was 2.43 μm, a tenth vibration wave amplitude was 1.93 μm, and a value of a ratio of the vibration wave amplitude=[(V10/V5)×100(%)] was 79.4%. It was found that damp of the vibration was large.

COMPARATIVE EXAMPLE 2

A device was obtained in the same manner as in Example 1 except that a protrusion height of an arch shape of a thin diaphragm portion was set to 4 μm in Comparative Example 2, and a vibrating property was similarly measured. As a result, a fifth vibration wave amplitude was 2.31 μm, a tenth vibration wave amplitude was 1.95 μm, and a value of a ratio of the vibration wave amplitude=[(V10/V5)×100(%)] was 84.4%. It was found that damp of the vibration was large.

COMPARATIVE EXAMPLE 3

A device was obtained in the same manner as in Example 1 except that a protrusion height of an arch shape of a thin diaphragm portion was set to 60 μm in Comparative Example 3, and a vibrating property was similarly measured. As a result, a fifth vibration wave amplitude was 1.31 μm, a tenth vibration wave amplitude was 0.79 μm, and a value of a ratio of the vibration wave amplitude=[(V10/V5)×100 (%)] was 60.3%. It was found that damp of the vibration was large.

COMPARATIVE EXAMPLE 4

A device was obtained in the same manner as in Example 1 except that a mounting width of a thin diaphragm portion was set to 300 μm, and a protrusion height was set to 0 μm in Comparative Example 4, and a vibrating property was similarly measured. As a result, a fifth vibration wave amplitude was 0.4 μm, a tenth vibration wave amplitude was 0.29 μm, and a value of a ratio of the vibration wave amplitude=[(V10/V5)×100(%)] was 72.5%. It was found that damp of the vibration was large.

COMPARATIVE EXAMPLE 5

A device was obtained in the same manner as in Example 1 except that a mounting width of a thin diaphragm portion was set to 2500 μm in Comparative Example 5, and a vibrating property was similarly measured. As a result, a fifth vibration wave amplitude was 3.71 μm, a tenth vibration wave amplitude was 2.73 μm, and a value of a ratio of the vibration wave amplitude=[(V10/V5)×100(%)] was 73.6%. It was found that damp of the vibration was large.

COMPARATIVE EXAMPLE 6

A device was obtained in the same manner as in Example 1 except that a height of a thick portion was set to 200 μm, a width of the thick portion was set to 1500 μm, and (the height of the thick portion/the width of the thick portion) was set to 0.13 in Comparative Example 6, and a vibrating property was similarly measured. As a result, a fifth vibration wave amplitude was 2.40 μm, a tenth vibration wave amplitude was 1.94 μm, and a value of a ratio of the vibration wave amplitude=[(V10/V5)×100(%)] was 80.1%. It was found that damp of the vibration was large.

COMPARATIVE EXAMPLE 7

A device was obtained in the same manner as in Example 1 except that a height of a thick portion was set to 1200 μm, a width of the thick portion was set to 200 μm, and (the height of the thick portion/the width of the thick portion) was set to 6.0 in Comparative Example 7, and a vibrating property was similarly measured. As a result, a fifth vibration wave amplitude was 2.36 μm, a tenth vibration wave amplitude was 1.88 μm, and a value of a ratio of the vibration wave amplitude=[(V10/V5)×100(%)] was 79.7%. It was found that damp of the vibration was large.

A piezoelectric/electrostrictive device of the present invention is effectively used in various types of industrial fields which require a piezoelectric/electrostrictive film type actuator (see "Piezoelectric/Electrostrictive Actuator: from Basic to Application" authored by Kenji Uchino, edited by Japanese Industrial Technical Center, and published Morikita Shuppan) of a uni-morph type or such a type to generate a flexural displacement, for use in an actuator utilizing the flexural displacement; various types of sensors such as a microphone sensor and a viscosity sensor for detecting fluid properties, sound pressure, micro weight, acceleration and the like; a filter; a transformer; a sound generator such as a speaker; a vibrator and an oscillator for power or communication; a display; a servo displacement element; a pulse driving motor; an ultrasonic motor and the like.

What is claimed is:

1. A piezoelectric/electrostrictive sensor device comprising:
    a ceramic substrate having a thick portion, a thin diaphragm portion mounted integrally on an end surface of the thick portion, and a cavity formed by the thick portion and the thin diaphragm portion to communicate with the outside; and
    a piezoelectric/electrostrictive element having a layered structure fixed to an outer surface of the thin diaphragm portion of the ceramic substrate and including a lower electrode, a piezoelectric/electrostrictive film, and an upper electrode, the thin diaphragm portion of the ceramic substrate being vibrated in conjunction with driving of the piezoelectric/electrostrictive element,
    wherein shape and dimension relations defined in the following (A) to (C) are satisfied;
    (A) a shape of the thin diaphragm portion is an outward protruding arch shape, and an outward protrusion height of the arch shape is in a range of 5 to 50 μm;

(B) a mounting width of the thin diaphragm portion is in a range of 600 to 2000 μm; and (C) a ratio (height/width) of the height to the width of the thick portion is in a range of 0.25 to 3, wherein the piezoe/ectric/electrostrictive element senses vibration of the thin diaphragm portion and at least the dimension relation of the thick portion is selected to reduce unwanted damping of the thin diaphragm portion.

2. The piezoe/ectric/electrostrictive device according to claim 1, comprising: a plurality of thin diaphragm portions; and a plurality of piezoe/ectric/electrostrictive elements fixed onto the outer surfaces of the thin diaphragm portions, the thin diaphragm portions and the piezoelectric/electrostrictive elements being disposed on a first plane and a second plane parallel to the first plane, respectively.

3. The piezoelectric/electrostrictive device according to claim 2, wherein the piezoelectric/electrostrictive element is formed by a film forming technology, and obtained by disposing a constituting material of the piezoe/ectric/electrostrictive element on the outer surface of the thin diaphragm portion, and thermally treating the constituting material to fix the constituting material onto the outer surface of the thin diaphragm portion.

4. The piezoelectric/electrostrictive device according to claim 1, comprising: a plurality of thin diaphragm portions; and a plurality of piezoe/ectric electrostrictive elements fixed onto the outer surfaces of the thin diaphragm portions, the thin diaphragm portions and the piezoelectric/electrostrictive elements being disposed on a first plane and at least one of a second plane parallel to the first plane and a third plane vertical to the first plane, respectively.

5. The piezoelectric/electrostrictive device according to claim 3, wherein the piezoelectric/electrostrictive element is formed by a film forming technology, and obtained by disposing a constituting material of the piezoe/ectric/electrostrictive element on the outer surface of the thin diaphragm portion, and thermally treating the constituting material to fix the constituting material onto the outer surface of the thin diaphragm portion.

6. The piezoelectric/electrostrictive device according to claim 1, wherein the piezoelectric/electrostrictive element is formed by a film forming technology, and obtained by disposing a constituting material of the piezoelectric/electrostrictive element on the outer surface of the thin diaphragm portion, and thermally treating the constituting material to fix the constituting material onto the outer surface of the thin diaphragm portion.

7. The piezoelectric/electrostrictive device according to claim 1, wherein a thickness of the thin diaphragm portion of the ceramic substrate is 100 μm or less.

8. The piezoelectric/electrostrictive device according to claim 1, wherein an outer shape of the thin diaphragm portion is one selected from the group consisting of a rectangular shape, an elongated circular shape, and an elliptic shape having an aspect ratio of 1.5 or more.

9. The piezoelectric/electrostrictive device according to claim 1, wherein a center of said upper electrode deviates from a center of said thin diaphragm portion by no more than 5% of the length of the thin diaphragm portion, when measured along a length direction of said thin diaphragm portion, and said center of said upper electrode deviates from said center of said thin diaphragm portion by no more than 10% of the width of the thin diaphragm portion, when measured along a width direction of said thin diaphragm portion.

* * * * *